United States Patent [19]

Stengl et al.

[11] Patent Number: 4,780,382
[45] Date of Patent: Oct. 25, 1988

[54] PROCESS FOR MAKING A TRANSMISSION MASK

[75] Inventors: Gerhard Stengl, Villach; Hans Löschner, Vienna, both of Austria

[73] Assignee: IMS Ionen Mikrofabrikations Systems Gesellschaft mbH, Vienna, Austria

[21] Appl. No.: 930,812

[22] Filed: Nov. 13, 1986

[30] Foreign Application Priority Data

Nov. 13, 1985 [AT] Austria .................................. 3312/85

[51] Int. Cl.⁴ .......................... G03F 9/00; G03C 5/00; G21K 5/00
[52] U.S. Cl. .......................................... 430/5; 430/296; 430/321; 430/323; 430/324; 430/329; 430/331; 430/394; 430/966; 378/34; 378/35; 156/643
[58] Field of Search .................. 430/5, 296, 321, 323, 430/324, 329, 331, 394, 966, 967; 378/34, 35; 156/643

[56] References Cited

U.S. PATENT DOCUMENTS

| | | | |
|---|---|---|---|
| 4,387,145 | 6/1983 | Lehrer et al. | 430/5 |
| 4,448,865 | 5/1984 | Bohlen et al. | 430/5 |
| 4,451,544 | 5/1984 | Kawabuchi | 430/5 |
| 4,497,884 | 2/1985 | Schmidt et al. | 430/5 |

FOREIGN PATENT DOCUMENTS

| | | | |
|---|---|---|---|
| 89742 | 7/1981 | Japan | 430/5 |
| 89741 | 7/1981 | Japan | 430/5 |

*Primary Examiner*—John E. Kittle
*Assistant Examiner*—Patrick J. Ryan
*Attorney, Agent, or Firm*—Karl F. Ross; Herbert Dubno

[57] ABSTRACT

The invention is a process for making a transmission mask which can be used in structuring a semiconductor substrate in an additive or subtractive way by two galvanic depositions of layers of which one provides the mask structure and the other a grid structure covering the openings in the mask structure. The thickness of the structure is freely selectable self-adjusting (within the limits of the known engineering methods). The aim is the production of a transmission mask with a constant effective thickness above the mask surface.

11 Claims, 5 Drawing Sheets

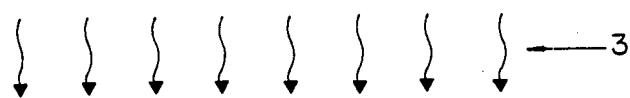
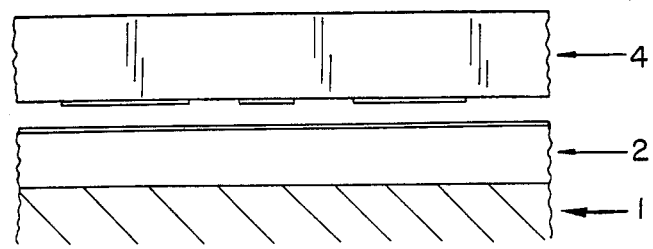
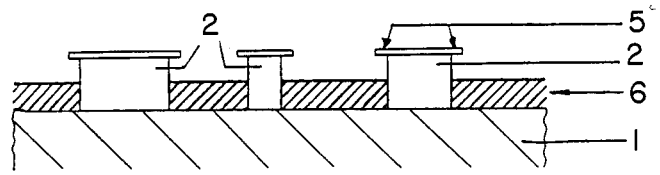
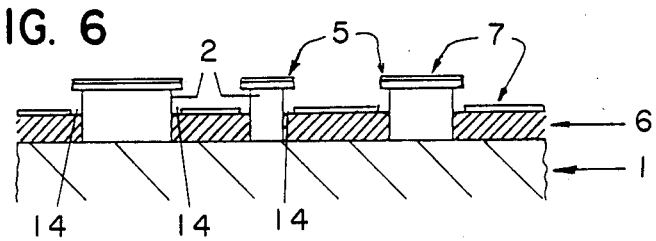
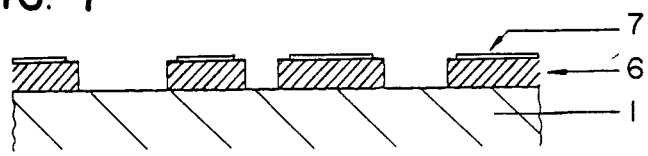

PROCESS FOR MAKING A TRANSMISSION MASK

FIELD OF THE INVENTION

Our present invention relates to a process for making a transmission mask for use in ion, electron or X-ray projection (high-energy beam) microlithography or substrate structure modification for an accurate transmission of structure to a substrate.

BACKGROUND OF THE INVENTION

A transmission mask can be made for distortion-free transfer of the structure of a transmission mask to a substrate.

A transmission mask with comparatively simple steps can be used in making dimensionally correct submicrometric structures with 1:1 electron or ion shadowgraphy or with ion or electron projection microlithography.

The transmission mask can comprise a mask foil with a surface structure which has a constant thickness over the entire mask surface as well as openings in the mask foil through which the high-energy beam transmission occurs. To increase the stability of the entire mask structure and thus to guarantee an accurate transmission the openings in the mask foil traverse a grid structure.

With sufficiently small crossbar width the cross members are irradiated by the image forming medium so that a continuous structuring occurs on the substrate to be processed which corresponds to the mask pattern. For wider grid cross members a multiple exposure process can be used in which the image of the image forming medium is displaced so that the cross members no longer appear in the image.

In order to compensate for a rigidity loss which is the result of the openings present, a corresponding strengthening or thickness increase of the grid cross members can be made.

A strengthening of the cross members of the grid is particularly necessary in the case of thermal stressing of the mask foil in order to prevent a nonuniform expansion of the mask foil and thus distortion of the transmitted structure. Although the need for a strengthened grid cross member for a square grid has been recognized where it is desirable to be able to clamp a mask foil in a mask frame having a higher thermal expansion coefficient than the foil, processes to make it have not been devised.

OBJECTS OF THE INVENTION

It is an object of our invention to provide an improved process for making a transmission mask which will obviate drawbacks of the prior art.

It is also an object of our invention to provide an improved process for making a transmission mask with sufficiently strengthened cross members so that a nonuniform expansion of the mask foil of the mask and hence distortion of the transmitted structure are prevented.

It is another object of our invention to provide an improved process for making a transmission mask with strengthened cross members so that the mask foil of the mask can be clamped into the holder for the mask without distortion of the transmitted structure.

SUMMARY OF THE INVENTION

These objects and others which will become more readily apparent hereinafter are attained in accordance with our invention in a process for making a transmission mask comprising a mask foil for use in structuring a workpiece, particularly a semiconductor workpiece or substrate, in which a plurality of regions of the transmission mask permeable to an image forming medium are formed on the workpiece, the region permeable to the image forming medium having a grid structure with a plurality of grid cross members strengthened in contrast to the mask foil.

According to our invention the grid usually formed by the entire surface of the mask is made only in the portion of the mask having openings which provide the structuring of the workpiece. If necessary the grid cross members overlap the edges of the portion of the mask providing that structuring.

Further according to our invention the grid structure is so formed that the effective thickness of the mask foil also in the grid region is substantially constant over the entire mask surface. Because of that it is also possible to make grid structures in the vicinity of 1 micrometer or less.

In both embodiments only a pattern of the mask structure and a pattern for a regular grid to form a uniform grid image over the entire mask surface is necessary.

Essential for the invention is that the structure of the grid in spite of a regular image formation over the entire mask surface is provided in a self-adjusting way only over the portion of the mask openings. A mask according to the process of our invention has the same effective thickness over the entire surface and can remain distortion free under a thermal load resulting from electromagnetic radiation or by a particle beam.

The process according to our invention for making a transmission mask with self-adjusting strengthened grid cross members in the above sense can be used in the all-important manufacturing processes of self supporting transmission masks, e.g. by galvanic techniques in the manufacture of thin silicon foils above highly doped regions with reduced etching rate and in the manufacture of thin foils from silicon nitride with a silicon ring holder.

In one embodiment an organic resist layer, e.g. with a thickness of 1.5 micrometer, is applied to a substrate whose surface is suitable for a galvanic deposition, e.g. a silicon wafer or a glass plate with a metallic contact layer on the surface. This resist layer is structured, e.g. by UV-illumination of a photomask and subsequent development by X-ray or ion beam lithography or advantageously scanning electron beam lithography.

On the structure-free region of the substrate bounded laterally by the resist layer a mask foil, e.g. of nickel, is grown galvanically up to a desired preselected thickness, advantageously to a thickness which is less than the thickness of the organic resist layer.

An electrical insulating layer, e.g. of silicon monoxide or magnesium oxide is applied particularly by sputtering or by vapor deposition to the free surface of the galvanically grown mask foil, if necessary with protection of edge strips at the boundaries of the resist layer so that in these edge strips there is no insulating layer.

Then the organic resist layer is removed thus providing gaps in the galvanically grown mask layer which reach to the substrate.

These gaps in the mask foil are filled by an additional resist layer which is applied to the substrate until its level above the substrate is higher than the level of the electrical insulating layer above the substrate.

The additional resist layer covering the free surface of the substrate together with the galvanically grown mask foil and the insulating layer is provided with a preferably regular grid structure, e.g. by photo-exposure and development.

The additional resist layer is removed from the portion of the mask receiving the cross members of the grid.

The substrate together with the mask foil on it with the insulating layer and the additional resist layer remaining in the form of individual blocks are subjected to a second galvanic process. A metal layer is grown to a preselected thickness between the blocks of the additional resist layer in that region whose base is electrically conductive.

The region of the mask foil covered with the insulating layer and the region received by the blocks on the insulating layer and on the free surface of the substrate in the vicinity of the gaps of the mask foil remain free of galvanically grown material.

The galvanic growth process continues until the free surface of the grown grid structure is higher than the free surface of the mask foil, advantageously until the free surface of the grid structure reaches the level of the free surface of the resistive block.

Finally the resist layer blocks are removed, e.g. by chemical dissolution or by plasma burning. The mask foil together with the grid is separated from the substrate, e.g. by dissolving of the substrate or by etching of the substrate in that region which is received by the mask foil, the substrate remaining as a ring and/or frame-like holder for the mask foil.

According to a second embodiment it is provided that on a substrate, e.g. a silicon wafer, a coating is applied in a layer or in a plurality of layers of materials different from each other which is more resistant to etching than is the material of the substrate.

The coating in the vicinity of its surface is covered with a mask comprising a resist layer. The coating together with the mask found on it are reacted by etching agents to form in the regions which are not covered by the resist material, depressions by removing coating material. The base of the depressions is higher than the plane separating the coating and the substrate.

Then the resist layer forming the mask is removed from the elevated portions on the coating and the bottoms of the depressions are covered, e.g. with a photo-lacquer or a vapor deposited layer. An additional mask layer is applied to the free surface of the elevated regions of the coating and the free surface of the coating of the bottoms of the depressions.

As the grid is structured the coating layer is removed, advantageously by etching, in those regions in which the surface of the coating layer is exposed and if necessary also the substrate extending from the exposed region is etched so that then, advantageously by plasma etching or by a reactive etching process, the elevated regions of the coating as well as the depressed regions of the coating are exposed, whereupon if necessary the substrate is removed leaving a ring in the edge region of the coating layer.

Particularly in the first embodiment of the process according to our invention, cross members of the grid structure may overlap the edge regions of the mask structure and thus the bond between the grid and the mask foil structure is improved. The thickness of the mask foil structure and the thickness (honeycomb height) of the grid structure are independent of each other and can be arbitrarily selected (within the limits imposed by the existing engineering knowledge).

In both embodiments of the process according to our invention the thickness of the grid structure can be increased so that as a result of the presence of the grid, no substantial rigidity loss caused by the openings when compared with the foil without the grid occurs so that the effective thickness of the grid region becomes approximately equal to the thickness of the nongrid structured surface region.

By use of the process of our invention in both embodiments a mask foil with strengthened grid cross members can be made in a self-adjusting way. "Self-adjusting" is understood in the sense that the mask structure region, i.e. the socalled designed region, which has no grid in situ produces the mask for the grid region so that in a second lithographic process a regular grid structure can be made with a suitable resistive layer over the entire mask surface. By the self adjustment, the grid structure is formed only in the region of the openings of the mask foil. The grid structure thickness (honeycomb height) is adjustable within limits technologically given by the resist layer thickness, that is the thickness of the grid structure is only limited by the resist layer thickness.

Consequently, in use of the process of the invention a very simple structure—for example a grid with a single grid constant, can be transferred for making the local grid structure allowing a simple use and good control of the process with submicrometer resolution as in laser holography.

Also the regular grid structure can be transferred effectively directly with demagnifying optical projection units (optical wafer steppers) over a large region with a geometric resolution in the submicrometer region (with planar resistive substrate). A corresponding improvement is obtainable with ion projection microlithography.

In a process according to which the grid structure as well as the mask structure is built up galvanically can be provided with the same goal of self adjustment that the resist layer structure is wider on its free surface than in the portion reaching into the substrate from the upper surface. This is attained preferably by subjecting the free surface of the resist layer after application of the substrate and before illumination of the resist layer to a hardening (desensitizing), e.g. by chlorobenzene. Thus in a subsequent development because of the presence of the resist surface portion of poor solubility, the resist layer structure has a spread out (roof like) free surface.

The spreading on the surface can occur also by application of a resist layer formed from three different layers having different properties. Thus first a relatively thick base layer is applied which then is covered by two thin layers applied on each other. The uppermost layer comprises a material which is optically sensitive or sensitive to an electron beam. In the upper layer hence the structure is transferred by electron beam or optical lithography and then in the centr layer, for example, by reactive etching. From the center layer the additional transfer can occur into the comparatively thick base layer in a controlled manner, the structural central layer producing the mask for this transfer. In this transfer then a lateral widening by suitable selection of etching parameters occurs so that the upper and/or middle layer which the mask has formed for etching projects relative to the base layer.

In this way the widened or roof like portions are formed on the free surfaces. Another possibility to widen the resist layer structure comprises steps wherein: first a thick resist layer is applied and the structure thereafter is made by electron beam lithography, wherein by the lateral scattering of the electron beam there is attained in the subsequent development a widening in the upper portion of the resist layer.

The wider region on the surface of the resist layer structure guarantees that on subsequent application of the electrically insulating layer by vapor deposition or sputtering the edge strips of the already present galvanically grown layer are situated in the shadow of the widened portion and thus kept free from the insulating layer. The edge strips free of the insulating material permit galvanic growth of the grid to produce grid cross members which are grown from the edge of the constructed structure so that a particularly good connection between grid and mask structure is attained.

In further developments of the second embodiment for making the grid in a substractive (structure removing) process, be provided so that the layer covering the bottoms of the depressions of the coating is applied in a manner that also elevated region of the coating are covered and thereafter the elevated regions are exposed to a level below the level of the elevated region by removing the layer, the bottoms of the depressions of the coating however may be left covered by the layer. The covering layer which is removed can be made simply in the aforementioned ways.

BRIEF DESCRIPTION OF THE DRAWING

The above and other objects, features and advantages of our invention will become more readily apparent from the following description, reference being made to the accompanying highly diagrammatic drawing in which:

FIGS. 4 to 11 are cross sectional views showing the steps of the process for making a transmission mask with associated grid structure according to our invention in which the construction of the structured regions of the transmission mask and the grid region occur in an additive manner.

SPECIFIC DESCRIPTION

Figure 1:
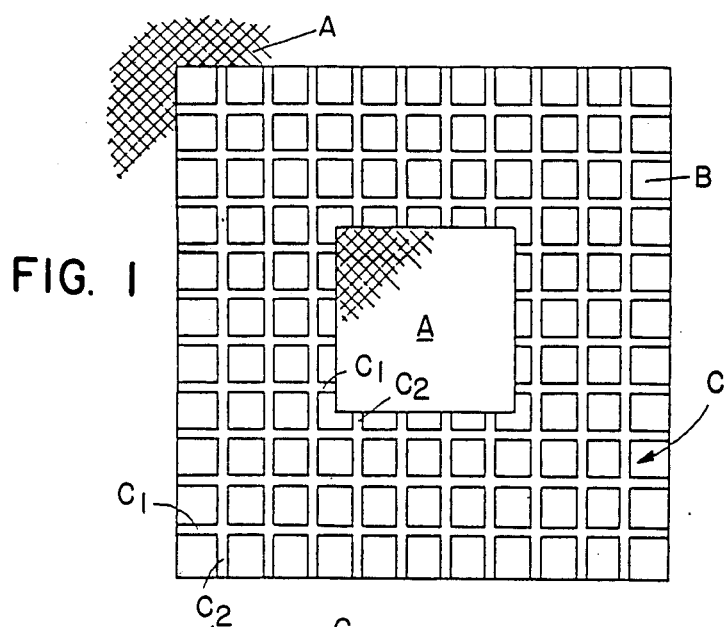
FIG. 1 is a partially cutaway top plan view of the structured region A of a mask foil according to our invention.
Figure 2:
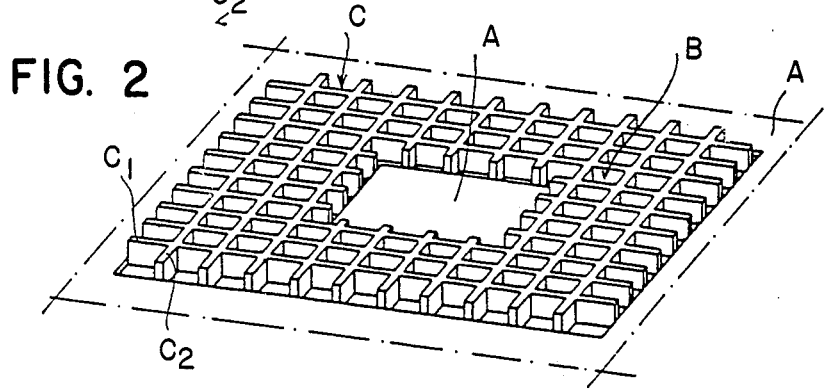
FIG. 2 is a partially cutaway perspective view of the structured region A of a mask foil according to our invention with openings B which are covered by grid C.
Figure 3:
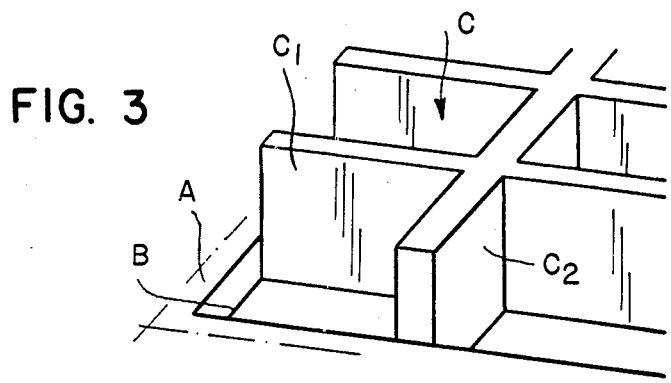
FIG. 3 is a fragmentary enlarged-scale perspective view of a corner of the grid C of FIGS. 1 and 2 showing the cross members C1 and C2.
Figure 8:
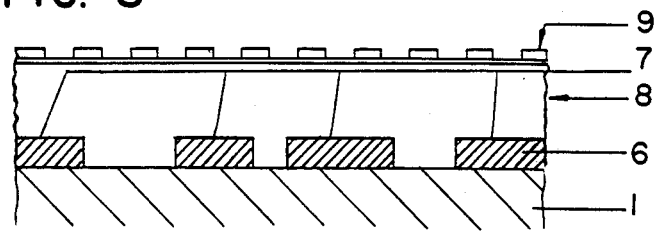

FIGS. 1–3 show a mask A whose structured portion has an opening which is formed with a grid structure C having crossbars $C_1$ and $C_2$.

On a substrate 1 whose surface is suitable for galvanic deposition a resist layer 2 is applied. A silicon wafer or also a glass plate with a metallic contact layer can be used as the substrate 1.

The thickness of the resist layer 2 advantageously comprising an organic material can be 1.5 micrometers. Structure is imparted to the resist layer 2 by a photomask 4. The transfer of structure of the photomask 4 can occur for example by UV-irradiation. The rays of UV radiation are indicated by the wavey arrows 3 in FIG. 4.

By suitable development of the resist layer 2 the structure is formed. The structure of the resist layer 2 can also alternatively be made by lithography, e.g. by X-radiation or ion lithography. Advantageously scanning electron beam lithography can be employed. The resist layer 2 is removed in the more intensely irradiated regions until the surface of the substrate 1 is reached so that on the substrate 1 empty regions arise laterally bounded by the resist layer 2. On said regions galvanically a mask foil 6 is grown advantageously from a nickel bath.

The material deposited from the nickel bath should advantageously have a thermal expansion coefficient which is close to the material of the substrate 1.

The thickness of the mask foil 6 is freely selectable however the thickness of the mask foil 6 is less than the thickness of the resist layer 2 which was applied to the substrate 1 in the first process step (FIG.4).

FIG. 5 shows the situation as it is after the galvanic growth of the mask foil or layer 6. As is apparent from FIG. 5 the structure of the resist layer 2 spreads on a surface displaced from the substrate 1. The spreading is indicated at 5 in FIG. 5.

The spreading 5 can be attained in a different way. Thus a chlorobenzene treatment of the free surface of the resist layer 2 on the substrate 1 in the first step of the process can be effected. By this chlorobenzene treatment the free surface of the resist layer 2 is desensitized and because of the slight solubility of the resist surface the appropriate spreading 5 occurs in subsequent development.

Now an electrically insulating layer 7 is coated on the free surface of the galvanically grown mask foil 6. This application, for example, can by effected by vapor deposition or sputtering. The layer 7 can be, for example, composed of silicon monoxide or magnesium oxide. On vapor deposition or sputtering also the surface of the resist layer 2 and thus also the spread regions 5 are covered with the electrically insulating layer 7.

FIG. 6 shows that the spread portions 5 of the resist layer 2 prevent the edge regions 14 adjacent to the resist layer 2 from being covered with the insulating layer 7. Now in a further step the layers 2 and 7 are removed from the substrate 1 (lift off). Inasmuch as the resist layer is a positive resist layer 2, acetone can be used in the removing step. What remains after the liftoff, as is apparent from FIG. 7, is the galvanically grown mask foil 6 on whose surface the insulating layer 7 remains as shown in FIG.7.

Figure 9:
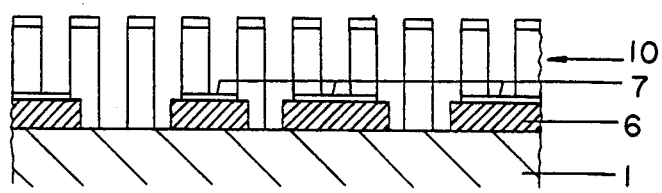

Now the grid is made. A thick additional resist layer 8 is coated over the substrate 1, the mask foil 6 found on it and the insulating layer 7. This resist layer 8 is planar and fills the openings of the mask foil 6. Over the entire portion of the substrate 1 occupied by the mask foil 6 a regular grid structure is developed as is indicated at 10 in FIG. 9. The transfer of the grid can however be effected by a multilayer process as yet to be explained in detail in order to obtain distinctive or characteristic high-angle resistive edges in the grid structure 10.

In one such multilayer lithographic process leads in the uppermost plane of the additional resist layer 8 to a structure 9 with a high degree of resolution. Said structure 9 then is accurately transferred to the comparatively thick resist layer 8 by a reactive ion etching process or by irradiation with UV light.

When a uniform resist layer is thus applied, it can have a thickness of about 5 micrometers; the making of the grid structure can occur by contact photolithography. When a three layer process is employed a base layer is first applied.

On the base layer an intermediate layer (e.g. 0.3 micrometers) of SiO is built up by vapor deposition and a topmost layer of an electron or photosensitive thin resist layer (e.g. 0.4 micrometers) is formed.

On the topmost layer a regular grid is formed by electron or photolithography and transferred into the SiO intermediate layer, e.g. in CHF$_3$ plasma. The transfer to the base layer occurs in an O$_2$ plasma, the structure of the intermediate layer acting as the mask.

The irradiation of the regular grid structure in resist layer 8 and/or use of the multilayer technology in the top layer 9 can occur with optical proximity or contact lithography by double irradiation with a line grating, the second irradiation being at right angles to the first. In this way a square grid structure is made, as is also possible with the help of laser holography.

Making a six-sided grid (honeycomb structure) is of advantage for mask stability and for the transmission factor of the grid region. This kind of regular grid structure can be made with the help of an optical wafer stepper or also by demagnifying ion projection microlithography.

After the grid structure 10 (FIG.9) has been produced, the substrate 1 together with the insulating layer 7 found on it covers the mask foil 6 (except the free edge region 14) and the additional resist layer 8, remaining in individual blocks 10, is subjected to a second galvanic process, whereby between the blocks of the additional resist layer 8 a metallic layer of a freely chosen thickness is grown extending from the electrically conduction region on the substrate I and the edge region 14 of the mask foil 6.

The portion of the mask foil 6 covered with the insulating layer 7 and the portions covered by the blocks of the additional resist layer 8 on the insulating layer 7 and also the portions on the free surface of substrate 1 in gaps between the mask foil 6 remain free of galvanically deposited material.

Figure 10:
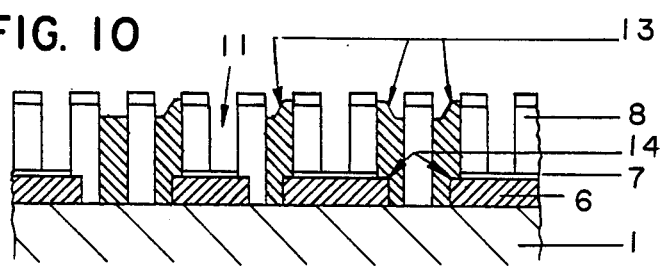

In the aforementioned galvanic deposition the layer thickness of the grid (comb height) is independent of the thickness of the mask foil 6 or more precisely of the thickness of the structured regions of the mask foil and thus can be produced so as to be substantially thicker than these regions. The automatic adjustment of the grid thickness due to these engineering principles results in a controllable overlapping between the structured region of the mask foil 6 and the grid 13 as is apparent from FIG. 10. Thus an increased stability is attained in the edge region of this structural region of the mask foil 6. The grid cross members C1,C2 are rigidly attached to the free edges 14 previously described.

Figure 11:
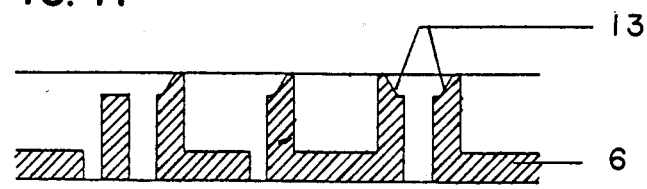
Figure 12:
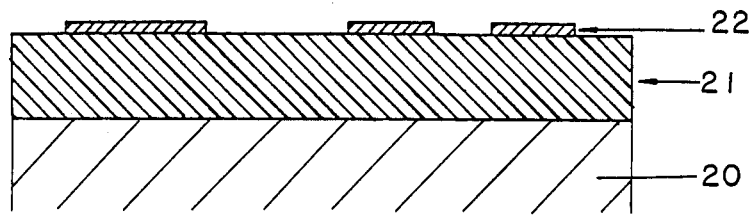
FIGS. 12 and 19 are similar views showing the steps of another process according to the invention.

In the next step now the additional resist layer 8 and/or the region 10 comprising the multiple resist layer is removed by chemical dissolving with appropriate solvent or by plasma burning. Finally the mask foil 6 is removed from the substrate 1 or, in case the substrate 1 simultaneously acts as the holder for the mask foil, the substrate 1 is only etched away in the region of the mask foil 6. The end product after removal of the additional resist layer 8 and/or the region 10 comprising the many layers is shown in FIG. 11.

One possibility for making the transmission mask in a subtractive process is shown schematically in FIGS. 12 to 19. Again a silicon wafer can be used as substrate 20. Such a wafer is practically error free, has very good surface properties and is commercially available. A coating 21 is applied to the substrate in one or more layers of different material. The coating 21 is one which is more highly resistive to etching solution than is the material from which the substrate 20 is composed.

The coating 21 can be composed of silicon nitride, boron nitride or in a multilayer structure can be composed of silicon oxide, silicon nitride and again silicon oxide. It is also possible to obtain the coating by an extremely high doping of a thin surface region of the substrate 20. The coating 21 is then covered on various regions of its surface with a mask comprising a resist layer 22.

Figure 13:
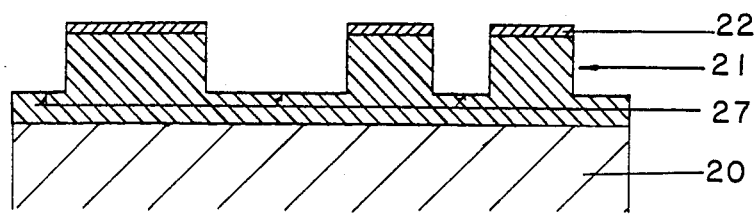

The coating 21 together with the mask comprising the resist layer 22 is reactively etched in the regions not covered by resist layer 22 to remove the material of the coating 21 and to form depressions. The depressions, however, do not reach to the bounding surfaces between the coating 21 and the substrate 20 (FIG. 13). The resist layer 22 forming a mask is removed from the elevated portions on the coating 21 and the bottom 27 of the depressions in the coating 2I are covered, for example, with a photolacquer or a vapor deposited layer 23.

Figure 14:
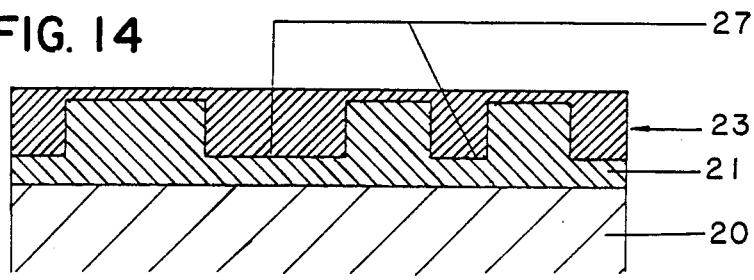
Figure 15:
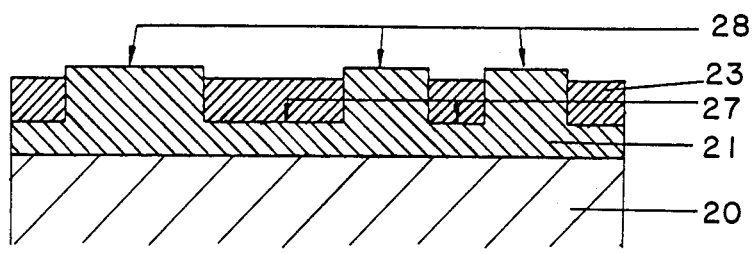

The layer 23 when composed of a photolacquer can be hardened. The layer 23 which covers the bottoms 27 of the depressions of the coating 21 can also be applied so thickly that the elevated regions of the coating 21 are directly covered. The elevated regions of the coating 21 are again exposed by removal of the topmost portion of the layer 23 by etching to a level below the level of the top surface 28 of the elevated regions. The bottom 27 of the depressions must however remain covered by the layer 23 (FIGS. 14 and 15).

Figure 16:
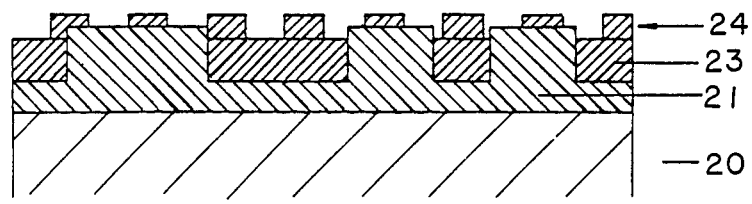
Figure 17:
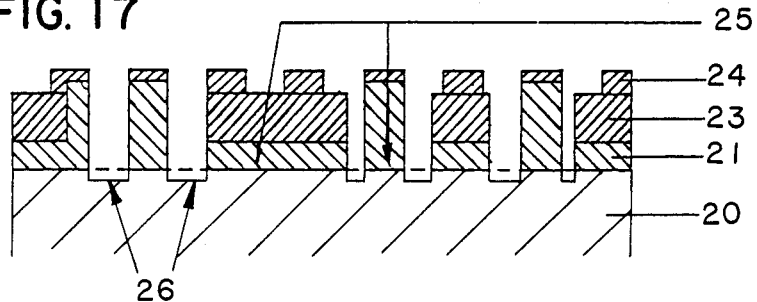

On the free surface 28 of the elevated regions of the coating 21 and the free surface of the covering layer 23 of the bottom 27 of the depressions another mask layer 24 is applied and built as a grid by a lithographic process (FIG. 16). The coating layer 21 is now removed (by etching) in those regions which are exposed. In this way the coating 21 is structured in the grid region. In the remaining regions 25 (FIG. 17) the coating 23 and/or the region covered by the grid mask layer 24 prevents etching of the layer 21.

Inasmuch as the coating 23 does not suffice as a mask for structuring the coating 21 an improved mask can be deposited in the depressions 27 by a vapor deposition process after building the depression in the coating layer 21 (FIG. 13).

The layer simultaneously deposited on the resist layer 22 is removed (lift-off) together with the resist layer 22. In this case a vapor deposited layer is found then in the depressions 27, the coating 23 (FIG.14) acts as a smoothing means and it is not essential that the coating 23 have mask properties. Thus it is possible in general to omit the coating 23 when the depth of penetration or focus of the lithographic process is suffient for the grid transfer, which is particularly the case in demagnifying ion projection microlithography in grid manufacture.

By over etching depressions 26 can arise in the substrate (FIG. 17) which depressions however do not disturb in the manufacturing process.

Figure 18:
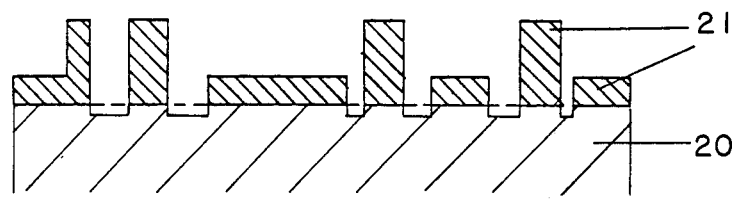
Figure 19:
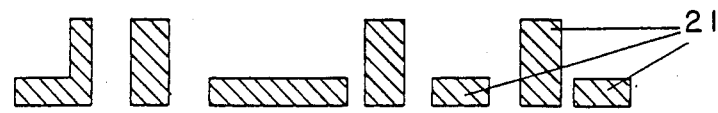

After removal of the coating layer 21 in that vicinity in which the surface of the layer is exposed, if possible by plasma etching or by a reactive etching process the elevated regions and also the sunken (depressed) regions of the coating 21 are exposed (FIG.18). Then the substrate 20 is removed by etching while leaving a ring in the edge region of the coating 21.

The previously described manufacturing process for a transmission mask can also be used when the coating 21 is a thin film for example boron nitride or silicon nitride deposited on the silicon substrate. The plasma etching steps (FIGS. 13 and 17) then are performed till is reached the required depth in the film. As the final step then the substrate 20 is etched away leaving a peripheral holding ring.

We claim:

1. In a process for making a transmission mask comprising a mask foil for use in the structuring of a workpiece, particularly of a semiconductor workpiece, in which a plurality of regions of said transmission mask permeable to an image forming medium are formed on said workpiece, said regions permeable to said image forming medium having a grid structure with a plurality of grid cross members strengthened in contrast to said mask foil, the improvement wherein said grid is made only in the portion of said mask having said permeable regions to provide said structuring of said workpiece, said grid cross members overlapping the edges of said portion of said mask providing said structuring, and said grid extending across openings formed in said permeable regions.

2. In a process for making a transmission mask comprising a mask foil for use in the structuring of a workpiece, particularly of a semiconductor workpiece, in which a plurality of regions of said transmission mask permeable to an image forming medium are formed on said workpiece, said regions permeable to said image forming medium having a grid structure with a plurality of grid cross members strengthened in contrast to said mask foil, the improvement wherein said grid is made only in the portion of said mask having said permeable regions to provide said structuring of said workpiece, said grid cross members overlapping the edges of said portion of said mask providing said structuring, and said grid extending across openings formed in said permeable regions and wherein said process comprises:

(a) applying a preferably organic resist layer to the surface of a substrate suitable for a galvanic deposition;

(b) structuring said organic resist layer;

(c) glavanically growing a mask foil to a predetermined thickness preferably less than that of said resist layer on the structure free regions laterally bounded by said resist layer;

(d) applying an electrically insulating layer to a free surface of said mask foil;

(e) removing said organic resist layer;

(f) filling in an additional resist layer in the gaps in said mask foil, which reach to said substrate and which are provided in said galvanically grown mask foil layer, until a level is reached which is higher than the level of said electrically insulating layer and covering said foil layer with said additional resist layer;

(g) exposing and developing said additional resist layer covering said otherwise free surfaces of said mask foil, said insulating layer and said substrate to provide a grid structure thereon only at said portion of said mask foil layer;

(h) subjecting the grid structure formed in step (g) to a second galvanic process to grow a metallic grid layer up to a predetermined thickness over said portion until a free surface of said grid layer lies higher than said free surface of said mask foil;

(i) removing said additional resist layer of said grid structure; and (j) separating said mask foil together with said grid layer from said substrate, whereby a portion of said substrate remains as a ring or frame like holder about said mask foil.

3. The improvement defined in claim 2 wherein said substrate is a glass plate with a metallic contact layer.

4. The improvement defined in claim 2 wherein said substrate is a silicon wafer.

5. The improvement defined in claim 2 wherein said organic resist layer has a thickness of 1.5 micrometers.

6. The improvement defined in claim 2 wherein said organic resist layer is structured by UV-illumination and subsequent X-ray, ion or electron projection microlithography.

7. The improvement defined in claim 2 wherein said electrical insulating layer is applied by vapor deposition or sputtering.

8. The improvement defined in claim 2 wherein said electrically insulating layer is composed of silicon monoxide or magnesium oxide.

9. The improvement defined in claim 2 wherein said free surface of said grid layer reaches said a surface of said additional resist layer.

10. The improvement defined in claim 2 wherein the structure of said additional resist layer is wider at a free surface of said additional resisitive layer than in a part thereof extending from said substrate to said free surface of said additional resistive layer.

11. A process for making a transmission mask, comprising:

(a) applying to a substrate, in a layer or a plurality of layers of material different from each other, a coating which is more resistant to etching than is the material of said substrate;

(b) providing the surface of said coating with a patterned mask of a resistive material so that said coating together with said mask on said coating can be etched;

(c) etching said coating together with said mask on said coating to remove coating material in the regions which are not covered by said resistive material and to form a plurality of elevated portions of said coating and a plurality of depressions whose bottoms are higher than the separating plane between said coating and said substrate;

(d) removing said resistive material forming said mask from said elevated portions of said coating;

(e) covering said bottoms of said plurality of depressions and said elevated portions of said coating with a photolaquer or a vapor depostied layer;

(f) removing said photolaquer or vapor deposited layer by etching to a level below said elevated portions of said coating but above said plurality of depressions to form a free surface of said coating;

(g) covering portions of said free surface of said elevated portions of said coating and said photolaquer or vapor deposited layer with an additional mask layer applied and build as a grid by a lithographic process;

(h) removing by etching the elevated portions of said elevations of said coating layer which are not beneath said additional mask layer, thereby structuring said elevated portions of said coating layer to form a grid;

(i) removing by etching said additional mask layer and said photolaquer or vapor deposited layer, leaving said coating; and (j) removing by etching all of said substrate except a holding ring at a border of said coating.

* * * * *

UNITED STATES PATENT AND TRADEMARK OFFICE
CERTIFICATE OF CORRECTION

PATENT NO. : 4,780,382

DATED : October 25, 1988

INVENTOR(S) : Gerhard Stengl, et al

It is certified that error appears in the above-identified patent and that said Letters Patent is hereby corrected as shown below:

Column 2, line 51: Insert --,--after "development";

Column 4, line 30: delete "--";

Column 8, line 4: "I2" should be --12--;

Column 8, line 29: "2I" should be --21--;

Signed and Sealed this

Sixteenth Day of May, 1989

Attest:

DONALD J. QUIGG

Attesting Officer     Commissioner of Patents and Trademarks